United States Patent
Chien et al.

[11] Patent Number: 5,879,993
[45] Date of Patent: Mar. 9, 1999

[54] NITRIDE SPACER TECHNOLOGY FOR FLASH EPROM

[75] Inventors: Wen-Cheng Chien, Kao-hsiung County; Hui-Jen Chu, Kao-hsiung; Chen-Peng Fan, Hsin-Chu Hsien, all of Taiwan

[73] Assignee: Taiwan Semiconductor Manufacturing Company, Ltd., Hsin-Chu, Taiwan

[21] Appl. No.: 940,001

[22] Filed: Sep. 29, 1997

[51] Int. Cl.⁶ .................................. H01L 21/8247
[52] U.S. Cl. ........................................... 438/266
[58] Field of Search ........................ 438/257–267

[56] References Cited

U.S. PATENT DOCUMENTS

| | | | |
|---|---|---|---|
| 5,183,771 | 2/1993 | Mitsui et al. | 437/44 |
| 5,328,860 | 7/1994 | Lee et al. . | |
| 5,489,546 | 2/1996 | Ahmad et al. | 437/57 |
| 5,573,965 | 11/1996 | Chen et al. | 437/41 |
| 5,679,589 | 10/1997 | Chen et al. . | |

*Primary Examiner*—Richard A. Booth
*Attorney, Agent, or Firm*—George O. Saile; Stephen B. Ackerman; Graham S. Jones, II

[57] ABSTRACT

A method of forming a spacer structure adjacent to the sidewall of a floating gate electrode with a top surface and sidewalls, the floating gate electrode being formed on a silicon oxide dielectric layer, and the silicon oxide dielectric layer being formed on the top surface of a semiconductor substrate include the following steps. Form a cap layer on the floating gate electrode, and a blanket tunnel oxide on the device. Form an inner dielectric, spacer layer over the device including the cap layer and the sidewalls thereby with conforming sidewalls, and an outer dielectric, spacer layer over the inner dielectric, spacer layer including the conforming sidewalls. Partially etch away the outer dielectric, spacer layer with a dry etch to form a outer dielectric spacer adjacent to the conforming sidewalls. Then partially etch away more of the outer dielectric, spacer layer with a wet etch to expose a portion of the conforming sidewalls of the inner dielectric, spacer layer. Finally, etch away the portion of the inner dielectric, spacer layer unprotected by the outer dielectric spacer before forming interelectrode dielectric layers and the control gate electrode.

20 Claims, 6 Drawing Sheets

NITRIDE SPACER TECHNOLOGY FOR FLASH EPROM

BACKGROUND OF THE INVENTION

1. Field of the Invention

This invention relates to method and structures for the manufacture of semiconductor memory devices and more particularly to improved flash EPROM devices.

2. Description of Related Art

The processing of a silicon nitride ($Si_3N_4$) spacer (180 Å) etching is very critical for this type of manufacturing process for flash EPROM devices. Because the dimensions of the $Si_3N_4$ spacers are so small, it is difficult to control and maintain this process. The function of this thin silicon nitride spacer is to prevent write disturbance that is caused by reverse tunneling.

In general sidewall spacers formed of multiple layers are known in the industry.

U.S. Pat. No. 5,573,965 of Chen et al. for "Method of Fabricating Semiconductor Devices and Integrated Circuits Using Sidewall Spacer Technology" shows a method of forming a transistor using multi-layered structures of silicon dioxide alone or of silicon dioxide/silicon nitride. Chen shows the first spacer layer underlying subsequent spacers which is similar in structure as the invention.

U.S. Pat. No. 5,183,771 of Mitsui et al. for "Method of Manufacturing LDDFET Having Double Sidewall Spacers" shows a method of forming a transistor having double sidewall spacers both formed from silicon oxide layers over silicon substrate adjacent to the polysilicon gate electrode of a compound polysilicon/polycide gate electrode of a CMOS device, without a floating gate electrode.

U.S. Pat. No. 5,489,546 of Ahmad et al. "Method of Forming CMOS Devices Using Independent Thickness Spacers in a Split-Polysilicon DRAM Process" shows a transistor having a double sidewall spacer formed over a gate oxide layer with both layers composed of silicon nitride designed to vary the channel length in a CMOS device with a compound polysilicon/polycide gate electrode, without any floating gate electrode. Ahmad et al. also shows the first spacer layer underlying the subsequent spacer.

The above patents do not show the details/(exact compositions of the two spacer layers) of the invention.

SUMMARY OF THE INVENTION

In accordance with this invention a spacer structure is formed of a combination of a silicon nitride spacer with a silicon oxide spacer.

In accordance with this invention where an EPROM device includes an HTO silicon oxide structure formed over a polysilicon floating gate electrode, the HTO oxide is protected by a silicon nitride spacer formed by depositing a blanket silicon nitride layer over the HOT oxide layer formed by depositing a blanket silicon oxide over the blanket silicon nitride layer. Then the following step is to etch back the silicon oxide layer to form sidewall spacers adjacent to the silicon nitride layer. Then, a combination silicon nitride/silicon oxide sidewall spacer is formed adjacent to the floating gate electrode.

In accordance with this invention a method is provided for forming a spacer structure adjacent to the sidewall of a floating gate electrode composed of doped polysilicon with a top surface and sidewalls, the floating gate electrode being formed on a silicon oxide dielectric layer, and the silicon oxide dielectric layer being formed on the top surface of a semiconductor substrate, the steps of the method comprising steps performed in the following sequence of steps.

a) Form a cap layer of polysilicon oxide over the top surface of the floating gate electrode followed by Form a thin, blanket, tunnel oxide film over the device.

b) Form a inner dielectric, spacer layer over the device including the cap and the tunnel oxide layer and adjacent to the sidewalls of the floating gate electrode thereby forming conforming sidewall spacers adjacent to the sidewalls of the floating gate electrode.

c) Form an outer dielectric, spacer layer over the inner dielectric, spacer layer including the conforming sidewalls.

d) Partially etch away the outer dielectric, spacer layer with a dry etch to form a outer dielectric spacer adjacent to the conforming sidewalls.

e) Perform the additional step of partially etching away more of the outer dielectric, spacer layer with a wet etch to expose a portion of the conforming sidewalls of the inner dielectric, spacer layer, and f) Etch away the portion of the inner dielectric, spacer layer unprotected by the outer dielectric spacer.

Preferably, the cap layer has a thickness of about 100 Å; the inner dielectric, spacer layer has a thickness of about 180 Å; and the outer dielectric, spacer layer comprises a thick silicon oxide layer.

Preferably, the wet etch of of step (e) is performed with a hydrofluoric acid solution of about 50 $H_2O$: 1 HF, the step (f) is performed in a wet etching process using a hot phosphoric acid solution ($H_3PO_4$); form an interelectrode dielectric layer over the device; and form a control gate electrode over the interelectrode dielectric layer to form a memory cell.

In accordance with another aspect of this invention, an EPROM semiconductor memory device is formed on a semiconductor substrate. There is a first gate oxide layer formed on the surface of the substrate; a floating gate electrode with a top surface and sidewalls formed on the surface of the gate oxide layer, the floating gate electrode being composed of doped polysilicon; a cap layer composed of an oxide of the floating gate electrode over the top surface of the floating gate electrode; a thin tunnel oxide layer covering the cap layer, the floating gate electrode and the gate oxide layer; a spacer structure adjacent to the sidewall of the floating gate electrode formed on the tunnel oxide layer above the gate oxide layer, the spacer structure comprising an inner dielectric, spacer layer and an outer dielectric, spacer layer formed over the device; the inner dielectric, spacer layer being formed as conforming L-shaped sidewalls adjacent to the sidewalls of the floating gate electrode; the outer dielectric, spacer layer being formed over the inner dielectric, spacer layer, the outer dielectric, spacer layer forming a spacer on the conforming L-shaped sidewalls of the inner dielectric, spacer layer; an interelectrode dielectric layer over the device cap, the spacer structure and the substrate; a control gate electrode over the interelectrode dielectric layer patterned with the floating gate electrode to form an gate electrode stack; the substrate including source/drain regions in the substrate cooperating with the gate electrode stack to form a memory cell.

Preferably, the cap layer has a thickness of about 100 Å, the inner dielectric, spacer layer comprises a silicon nitride layer having a thickness of about 180 Å, and the outer dielectric, spacer layer comprises a thick silicon oxide layer.

An advantage of the method of this invention is that it is easy to control and maintain the process.

Another advantage of the method of this invention is that the loss of the HTO (tunnel) oxide layer is reduced by the protection thereof provided by this method.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

The process of FIGS. 1A–1G illustrate a first method for producing an EPROM device 10 with a HTO thermal oxide cap 18 and above the floating gate of the EPROM device 10. The problem with this method is that the silicon nitride spacers 24S, 24S' are thinned by the process used which makes it difficult to satisfy manufacturing specifications.

Figure 1A:
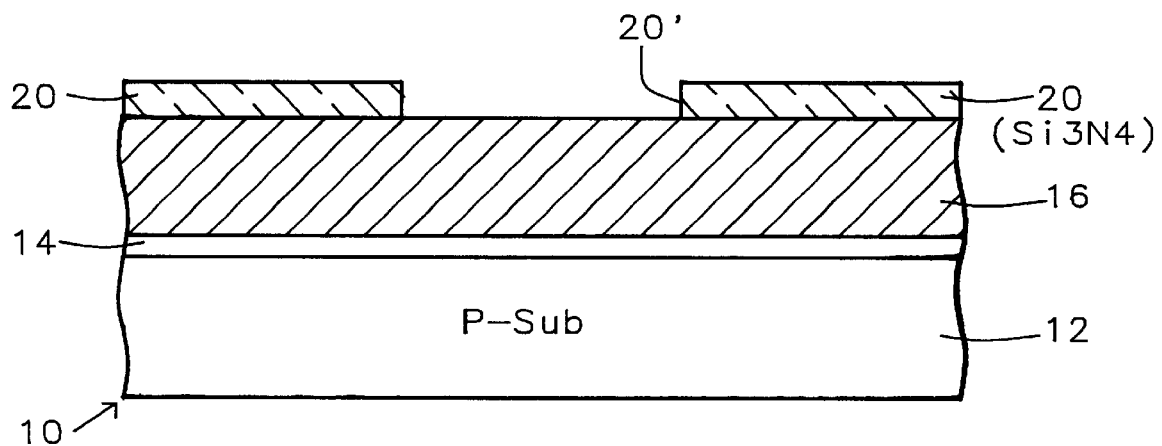
FIGS. 1A–1G illustrate the process steps of a method for producing an EPROM device with a HTO thermal oxide cap and above the floating gate of the EPROM device.

Referring to FIG. 1A, an EPROM device 10 is shown in a early stage of a possible manufacturing process which exemplifies the problem solved by this invention. A P-doped, silicon, semiconductor substrate 12 has a gate oxide layer 14 formed on the surface thereof. Above the gate oxide layer 14, a doped polysilicon conductor layer 16 has been deposited. Then a silicon nitride ($Si_3N_4$) mask 20 with opening 20' has been formed over the doped polysilicon conductor layer 16 by a process of Chemical Vapor Deposition (CVD) in a furnace in an atmosphere of $HN_3$ and silane $SiH_4$ to form the silicon nitride mask layer 20.

Figure 1B:
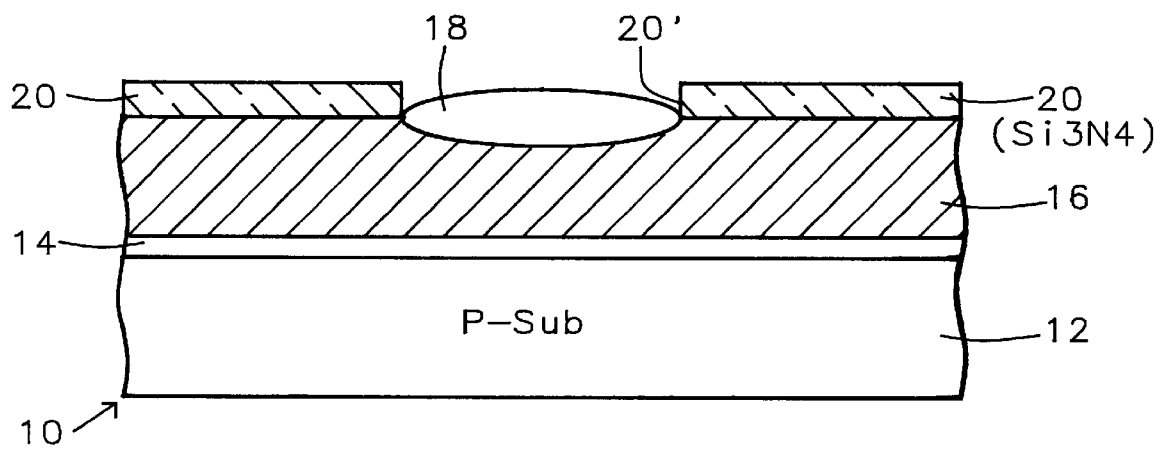

Referring to FIG. 1B the EPROM device 10 of FIG. 1A is shown after a thermal oxidation process has been employed to form a polyoxide (poly-silicon oxide) cap 18 with a by a HTO (High Temperature Oxide) process thickness of about 1,500 Å through the opening 20' in the $Si_3N_4$ mask 20 in a conventional HTO (High Temperature Oxidation) process by CVD (Chemical Vapor Deposition).

Figure 1C:
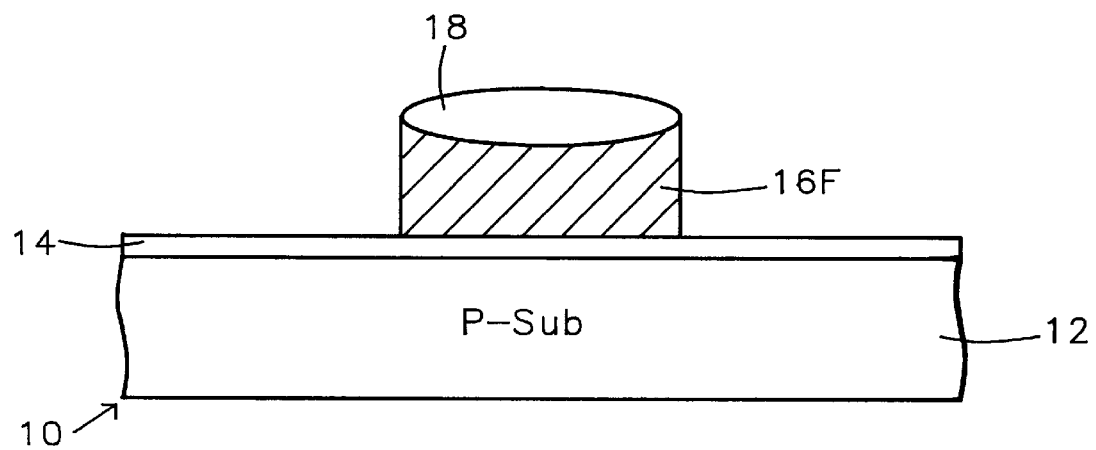

Referring to FIG. 1C the EPROM device 10 of FIG. 1B is shown after the silicon nitride ($Si_3N_4$) mask 20 has been stripped away. The newly exposed portion of the doped polysilicon conductor layer 16 which was unprotected by the silicon oxide cap 18 was etched away by an anisotropic plasma etching process with an etchant gas mixture composed of $C_2F_6$ gas and helium (He) gas which gas mixture removes the exposed portion of blanket polysilicon layer 16 but does not attack the exposed silicon oxide cap 18 forming the floating gate electrode 16F from the blanket polysilicon layer 16.

Figure 1D:
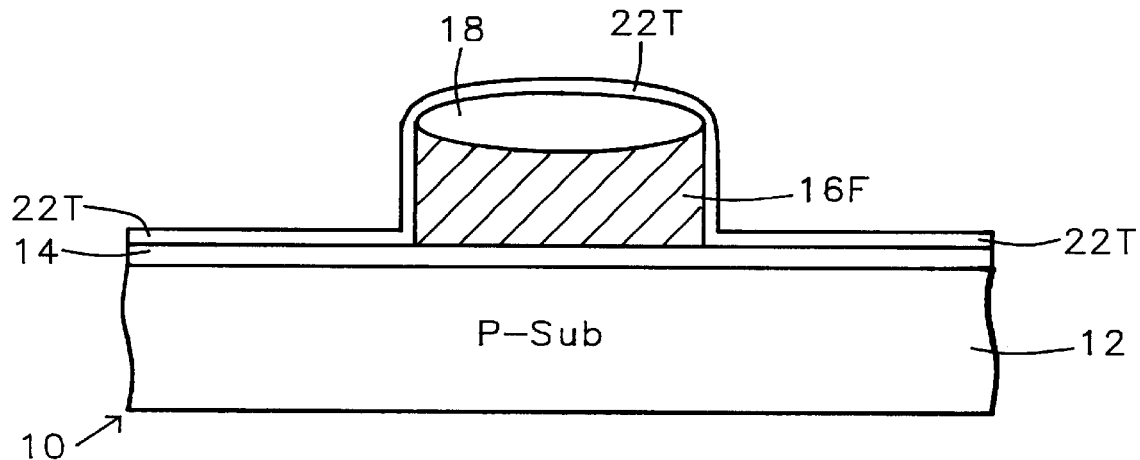

Referring to FIG. 1D the EPROM device 10 of FIG. 1C is shown after deposition of a blanket tunnel oxide layer 22T covering device 10. Tunnel oxide layer 22T comprises a thin silicon oxide layer as will be well understood by those skilled in the art.

Figure 1E:
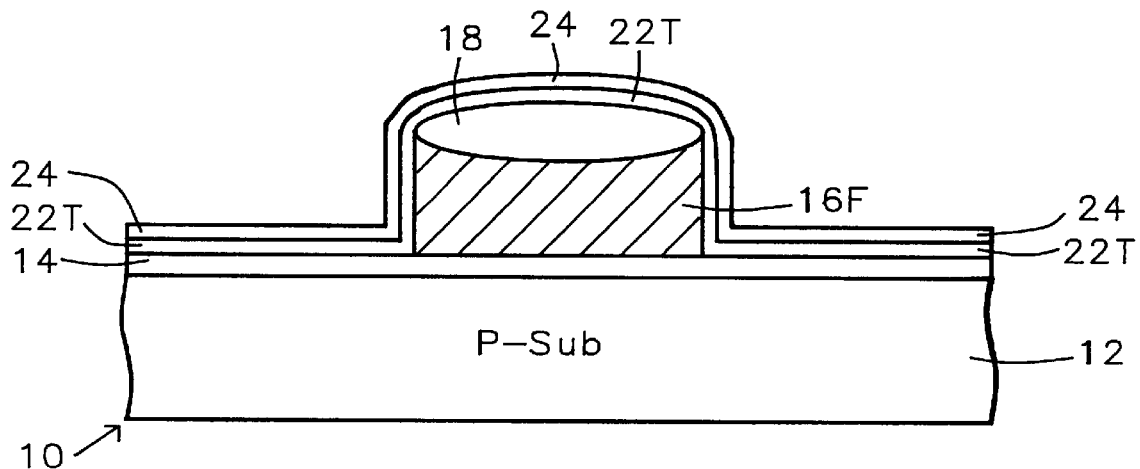

Referring to FIG. 1E the EPROM device 10 of FIG. 1D is shown after deposition of a blanket silicon nitride ($Si_3N_4$) spacer layer 24 covering blanket tunnel oxide (silicon oxide) layer 22T with a thickness of about 180 Å.

Figure 1F:
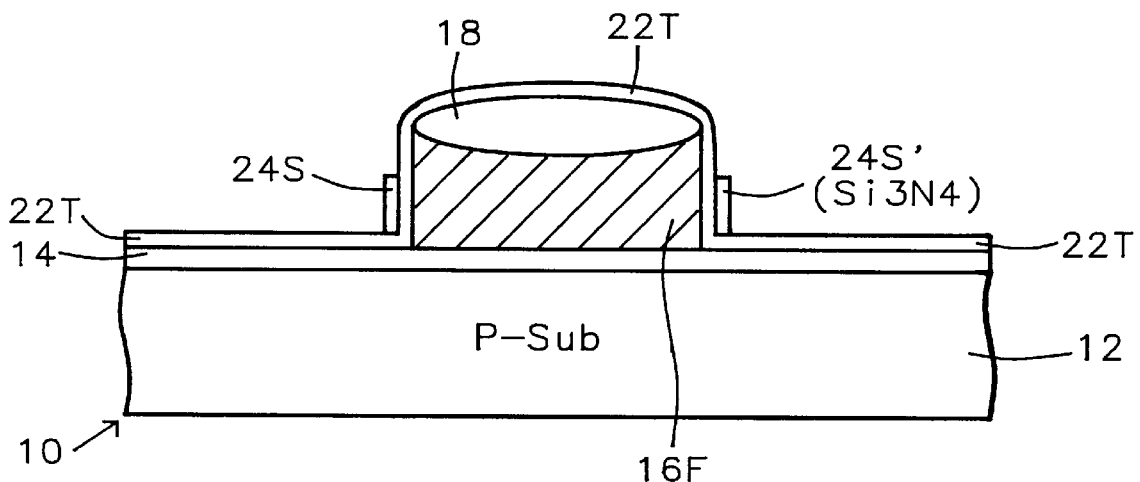

Referring to FIG. 1F the EPROM device 10 of FIG. 1E is shown after the silicon nitride spacer layer 24 has been etched by a plasma etching step with an etchant composed of sulfur hexafluoride ($SF_6$) and oxygen gas ($O_2$) to produce silicon nitride spacers 24S, 24S' adjacent to the sidewalls of floating gate electrode 16F. The spacers 24S, 24S', which are substantially shorter than the sidewalls of floating gate electrode 16F, have a remaining thickness of about 300 Å vertically (y axis) and a thickness of about 50 Å horizontally (x axis) from the sidewall of the floating gate electrode 16F. The silicon nitride spacers 24S, 24S' adjacent to the sidewalls of floating gate electrode 16F are used to protect against the reverse tunneling from the control gate electrode 28 in FIG. 1G to the floating gate electrode 16F.

Figure 1G:
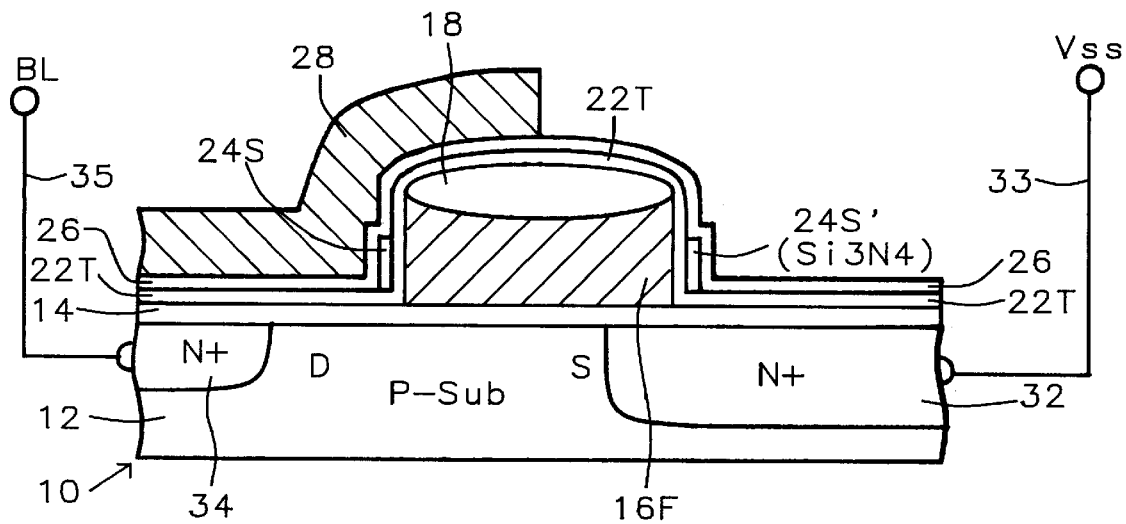

Referring to FIG. 1G the EPROM device 10 of FIG. 1F is shown after an N+ doped source region 32 and an N+ doped drain region 34 have been formed in the substrate 12 by ion implantation in accordance with a conventional process of angular ion implantation so that the source region 32 underlies the floating gate 16F.

After source region 32 and drain region 34 were formed a blanket second gate oxide layer 26 and a blanket control gate electrode layer were deposited on the device 10. Next followed etching of control gate electrode layer to form the control gate electrode 28.

The blanket second gate oxide layer 26 was deposited to cover the exposed surfaces of the tunnel oxide layer 22T and silicon nitride spacers 24S, 24S' as well as exposed portions of the upper sidewalls of floating gate electrode 16F, and silicon oxide cap 18. The doped polysilicon control gate electrode 28 has been patterned to lie over the left side of the device 10 overlying the left edge of the silicon oxide cap 18.

In addition note that the source region 32 is connected to the voltage source $V_{ss}$ as indicated by the schematic line 33 and the drain region 34 is connected to the bit line BL by schematic line 35.

One problem with the process of FIGS. 1A–1G is that it is very difficult to maintain the process because the process has an etching window which is very small on the order of a 3" process. It is difficult to maintain an etch recipe with a low etch rate and good uniformity. In addition, the problem of thinning the silicon nitride spacer layer 22 with a thickness of about 180 Å led to the design described below with reference to FIGS. 2A–2I.

Figure 2A:
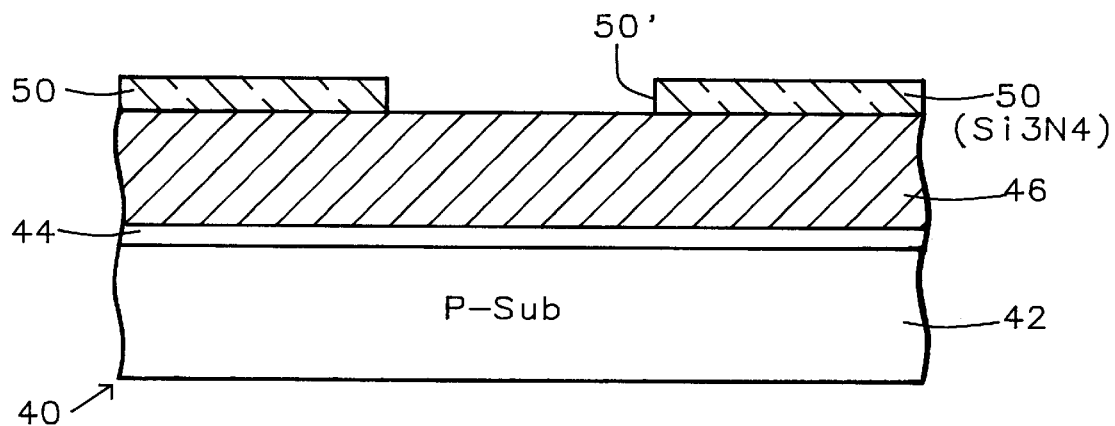
FIGS. 2A–2I illustrate the process steps of a method for producing an EPROM device with a HTO thermal oxide cap and above the floating gate of the EPROM device in accordance with the method of this invention.

Referring to FIG. 2A, an EPROM device 40 is shown in a early stage of a manufacturing process in accordance with this invention. A P-doped, silicon, semiconductor substrate 42 has a gate oxide layer 44 formed on the surface thereof. A doped polysilicon conductor layer 46 has been deposited above gate oxide layer 44. Then a silicon nitride ($Si_3N_4$) mask 50 with opening 50' has been formed over the doped polysilicon conductor layer 46.

Figure 2B:
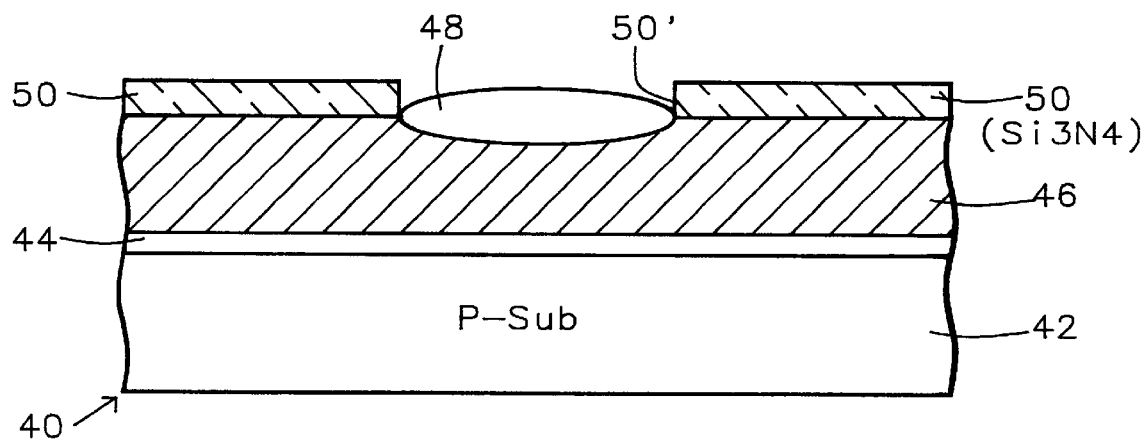

Referring to FIG. 2B the EPROM device 40 of FIG. 2A is shown after a thermal oxidation process has been employed to form a polyoxide (poly-silicon oxide) cap 48 with a thickness of about 1,500 Å through the opening 50' in the $Si_3N_4$ mask 50 in a conventional HTO (High Temperature Oxidation) process by Chemical Vapor Deposition (CVD).

Figure 2C:
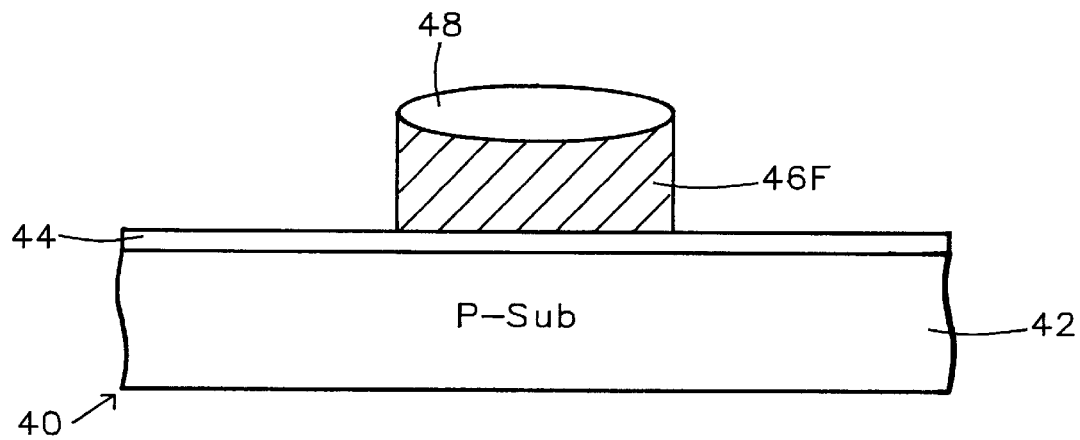

Referring to FIG. 2C the EPROM device 40 of FIG. 2B is shown after the silicon nitride ($Si_3N_4$) mask 50 has been stripped away with the portion of the doped polysilicon conductor layer 46 which was unprotected by the silicon oxide cap 48. Layer 46 was etched using an anisotropic plasma etching process with an etchant gas mixture composed of $C_2F_6$ gas and helium (He) gas which gas mixture removes the exposed portion of blanket polysilicon layer 46 but does not attack the exposed silicon oxide cap 48 forming the floating gate electrode 46F from the blanket polysilicon layer 46.

Figure 2D:
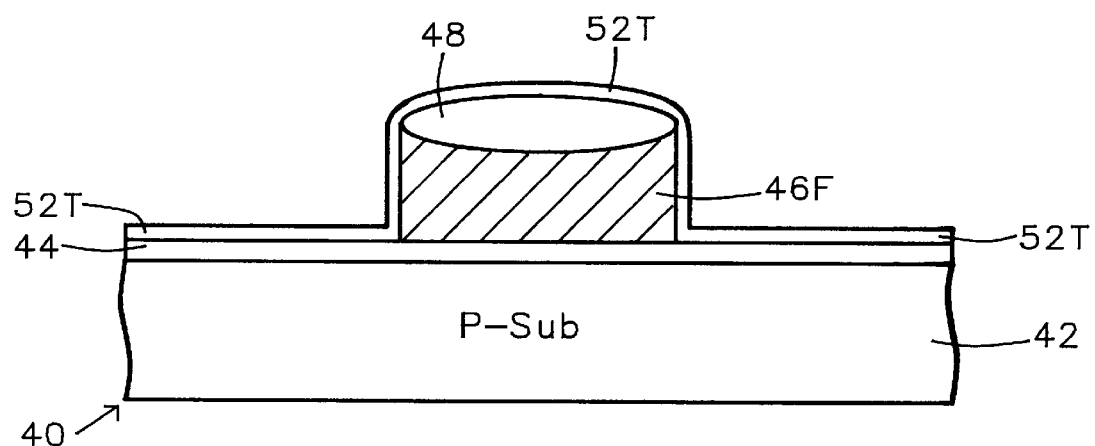

Referring to FIG. 2D the EPROM device 40 of FIG. 2C is shown after deposition of a blanket tunnel oxide layer 52T covering device 40. Tunnel oxide layer 52T comprises a thin silicon oxide layer as will be well understood by those skilled in the art.

Figure 2E:
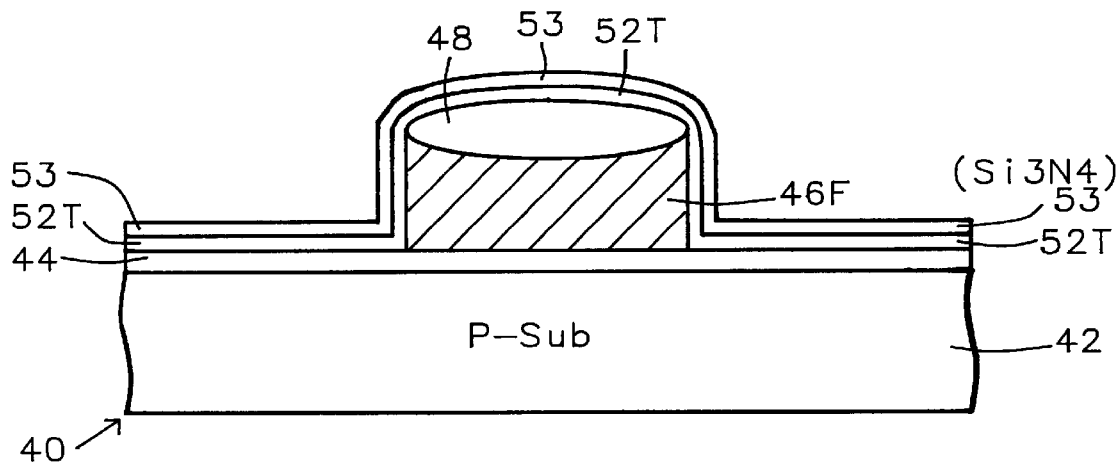

Referring to FIG. 2E the EPROM device 40 of FIG. 2D is shown after deposition of a blanket silicon nitride ($Si_3N_4$) spacer layer 53 has a thickness within a range from about 140 Å to about 180 Å, preferably with a thickness of about 180 Å. The silicon nitride ($Si_3N_4$) spacer layer 53 has sidewalls adjacent to the sidewalls of the floating gate electrode 46F conforming to the pattern thereof.

Figure 2F:
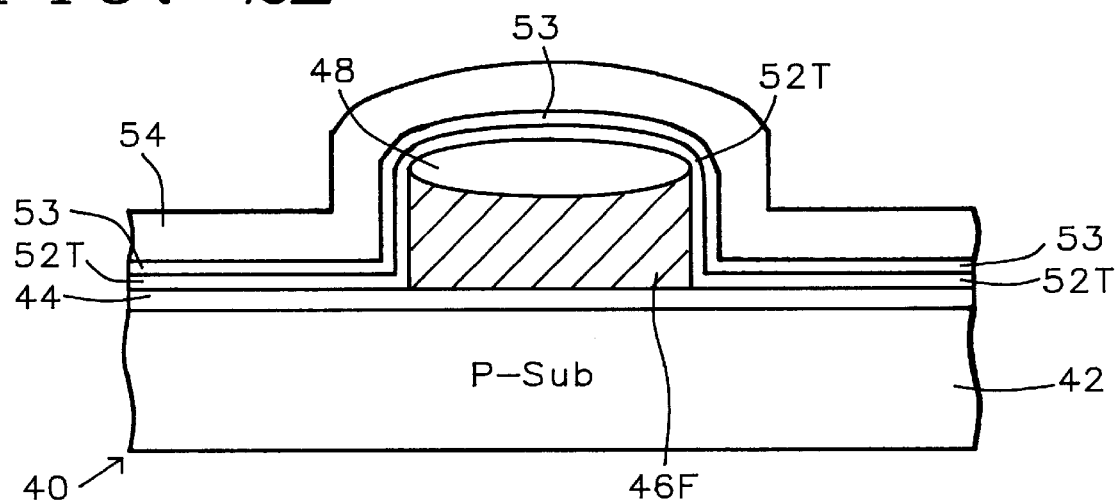

Referring to FIG. 2F the EPROM device 40 of FIG. 2E is shown after formation of a blanket silicon oxide film 54 by a deposition process such as low temperature PECVD (Plasma Enhanced Chemical Vapor Deposition) using a TEOS (TetraEthylOrthoSilicate) source. The blanket silicon oxide film 54 has a thickness from about 700 Å to about 1,200 Å, (preferably a thickness of about 1000 Å) over the silicon nitride ($Si_3N_4$) spacer layer 53.

Figure 2G:
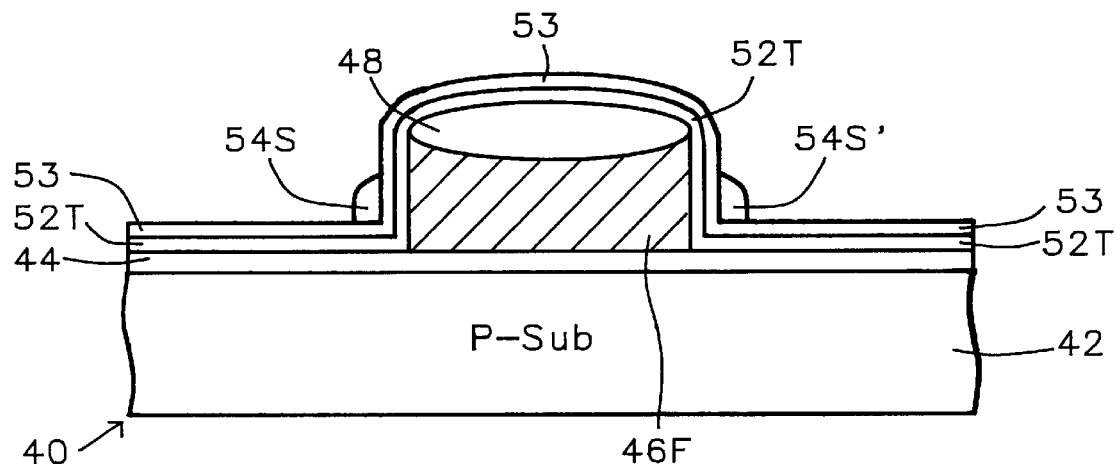

Referring to FIG. 2G the EPROM device 40 of FIG. 2F is shown after anisotropic dry etching of the silicon oxide film 54 leaving silicon oxide sidewall spacers 54S, 54S', which are substantially shorter than the sidewalls of floating gate electrode 46F, adjacent to the sidewalls of the silicon nitride layer 53. The dry etching is performed by plasma etching of the silicon oxide film 54 in an atmosphere comprising a mixture of etchant gases composed of $C_2F_6$ gas and helium (He) gas which gas mixture etches back the exposed portion of blanket silicon oxide layer 54 with a high degree of selectivity between the silicon oxide layer 54 and the silicon nitride layer 53 below.

Figure 2H:
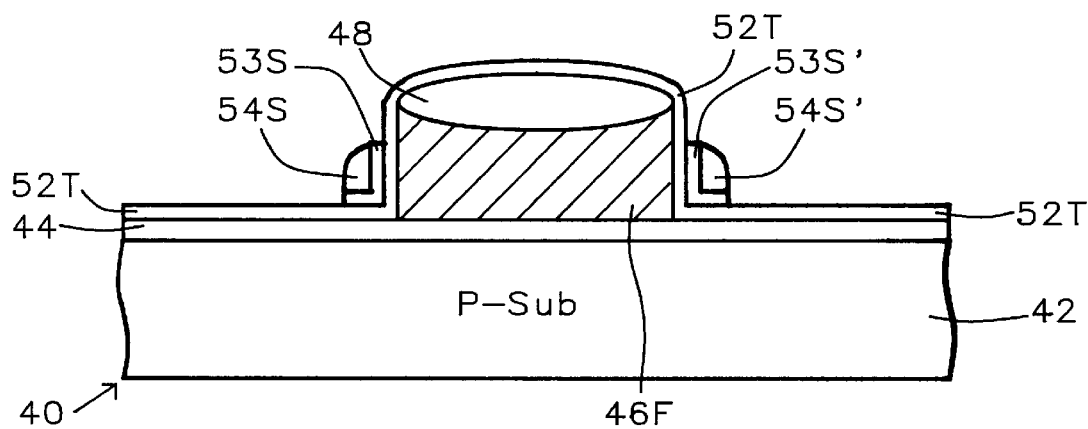

Referring to FIG. 2H the EPROM device 40 of FIG. 2G is shown after a wet oxide etch with an etchant (such as a hydrofluoric acid solution of 50 $H_2O$: 1 HF) to remove an additional portion of the material of the silicon oxide spacers 54S to adjust the radius thereof to a radius from about 200 Å to about 400 Å to provide reduced size silicon oxide spacers 54S' covering the silicon nitride ($Si_3N_4$) layer 53 to provide protection thereof and to provide the precisely planned size of silicon nitride ($Si_3N_4$) spacers 53S, 53S' to be formed in the next step.

Then in the next step, the exposed surfaces of silicon nitride ($Si_3N_4$) spacer layer 53 are etched in wet hot $H_3PO_4$ (phosphoric acid) to remove the portions thereof unprotected by the silicon oxide spacers 54S' producing silicon nitride spacers 53S, 53S'. Note that the silicon oxide spacers 54S, 54S' fill in the space defined by the "L" shaped silicon nitride spacers 53S, 53S'. The precisely planned L-shaped silicon nitride spacers 53S, 53S' adjacent to the floating gate electrode 46F protect against the reverse tunneling from the floating gate electrode 46F to the control gate electrode 58, as seen in FIG. 2I.

The silicon nitride spacers 53S, 53S' have a thickness as stated above from about 140 Å to about 180 Å have a height of the upright portion of the "L" of about 300 Å vertically (y axis) and a width of the horizontal portion of the "L" of about 200 Å horizontally (x axis) from the sidewall of the floating gate electrode 46F. The silicon oxide spacers 54S, 54S' have dimensions of from about 150 Å to about 300 Å.

The height and width of the $Si_3N_4$ spacers 53S, 53S' can be controlled easily using the process of this invention because the wet etching rate of silicon nitride layer 53 is very low, (about 60 Å/minute) so it is very easy to control the process time (process window<5').

Figure 2I:
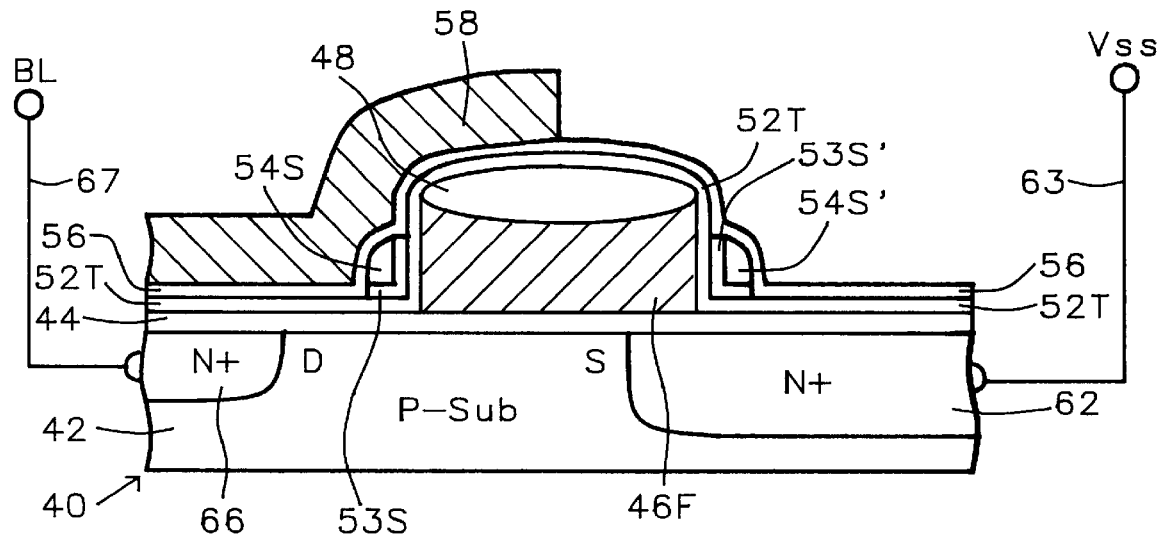

Referring to FIG. 2I the EPROM device 40 of FIG. 2H is shown after an N+ doped source region 62 and an N+ doped drain region 66 have been formed in the substrate 42 by ion implantation in accordance with a conventional process of angular ion implantation so that the source region 62 partially underlies the floating gate 46F.

After source region 62 and drain region 66 were formed a blanket second gate oxide layer 56 and a blanket control gate electrode layer 58 composed of doped polysilicon were deposited on the device 40. Next followed etching of control gate electrode layer to form the control gate electrode 58. The doped polysilicon control gate electrode 58 has been patterned to lie over the left side of the device 40 overlying the left edge of the silicon oxide cap 48.

Note that the blanket second gate oxide layer 56 was deposited over device 40 covering the exposed surfaces of the tunnel oxide layer 52T, silicon nitride spacers 53S, 53S', silicon oxide spacers 54S, 54S' as well as exposed portions of the upper sidewalls of floating gate electrode 46F. Note that polysilicon oxide cap 48 is already covered by tunnel oxide layer 52T.

In addition note that the source region 32 is connected to the voltage source $V_{ss}$ as indicated by the schematic line 63 and the drain region 66 is connected to the bit line BL by schematic line 67.

Also, a doped polysilicon control gate electrode 58 has been formed over the left size of the device overlying the left edge of the silicon oxide cap 48. Second gate oxide layer 56 preferably has a thickness from about 100 Å to about 150 Å.

Table I below lists experimental data which was recorded using the process of FIGS. 2A–2H. Table II below lists the data for the process of FIGS. 1A–1E.

TABLE I

W.A.T. DATA SHEET

PRODUCT: TM418  PROCESS: 05TW17S1
LOT ID: A52531.5  DATE: 03/27/1997

| WAF ID | SITE ID | BVOX_NHAC V I = −100 nA | FTV/.6 V | RTV/.6 V |
|---|---|---|---|---|
| 1 | −1 | −23.00 | 7.500 | −19.30 |
| 1 | −2 | −21.80 | 7.670 | −20.50 |
| 1 | −3 | −23.80 | 7.930 | −20.60 |
| 1 | −4 | −23.50 | 7.620 | −20.30 |
| 1 | −5 | −21.50 | 7.720 | −20.30 |
| 2 | −1 | −24.20 | 0.0000E + 00 | −18.00 |
| 2 | −2 | −23.70 | 7.790 | −20.40 |
| 2 | −3 | −23.90 | 7.790 | −20.30 |
| 2 | −4 | −24.20 | 0.0000E + 00 | −20.30 |
| 2 | −5 | −24.00 | 7.740 | −20.20 |

FTV = Forward Tunneling Voltage
RTV = Reverse Tunneling Voltage
BVOX_NHAC = Breakdown Voltage OXide_N(N-type) High voltage ACtive device.
WAF ID = Wafer Identification
Site ID = Site Identification
Specifications
about FTV < RTV
about 7V < −18.0 V
BVOX_NHAC about −23.00 V

TABLE II

W.A.T. DATA SHEET

PRODUCT: TM418  PROCESS: 05TW17S1
LOT ID: A52531.5  DATE: 03/27/1997

| WAF ID | SITE ID | BVOX_NHAC V I = −100 nA | FTV/.6 V | RTV/.6 V | |
|---|---|---|---|---|---|
| 6 | −1 | −19.80 | 7.390 | −17.00 | M/E 20" HTO = 100Å |
| 6 | −2 | −19.00 | 7.680 | −17.60 | |
| 6 | −3 | −19.80 | 7.890 | −17.10 | O/E 33" |
| 6 | −4 | −20.00 | 7.530 | −17.30 | |
| 6 | −5 | −19.90 | 7.590 | −17.50 | |
| 7 | −1 | −20.30 | 7.500 | −19.90 | |
| 7 | −2 | −19.90 | 7.660 | −20.20 | O/E 30" |
| 7 | −3 | −19.30 | 7.930 | −20.10 | |
| 7 | −4 | −19.50 | 7.650 | −20.40 | |
| 7 | −5 | −20.30 | 7.680 | −19.80 | |
| 8 | −1 | −20.70 | 7.630 | −20.60 | |
| 8 | −2 | −20.50 | 7.850 | −20.70 | O/E 25" |
| 8 | −3 | −21.10 | 8.060 | −20.60 | |
| 8 | −4 | −20.80 | 0.0000E+00 | −20.50 | |
| 8 | −5 | −20.70 | 7.750 | −20.60 | |
| 9 | −1 | −21.00 | 9.250 | −21.10 | |
| 9 | −2 | −19.80 | 9.640 | −21.20 | O/E 15" |
| 9 | −3 | −20.10 | 9.730 | −21.20 | |
| 9 | −4 | −20.90 | 0.0000E+00 | −21.10 | |
| 9 | −5 | −20.10 | 9.550 | −21.20 | |
| 10 | −1 | −20.60 | 10.20 | −21.20 | |
| 10 | −2 | 20.20 | 10.50 | −21.20 | O/E 10" |
| 10 | −3 | −21.30 | 10.80 | −21.20 | |
| 10 | −4 | −20.20 | 10.20 | −21.20 | |
| 10 | −5 | −21.20 | 10.60 | −21.20 | |
| 11 | −1 | −22.60 | 11.00 | −21.20 | |
| 11 | −2 | −22.20 | 11.00 | −21.30 | |
| 1i | −3 | −23.30 | 11.00 | −21.20 | O/E 5" |
| 11 | −4 | −22.20 | 0.0000E+00 | −21.20 | |
| 11 | −5 | −22.20 | 11.00 | −21.30 | |
| 12 | −1 | −23.20 | 11.00 | −21.30 | |
| 12 | −2 | −24.90 | 11.00 | −21.30 | |
| 12 | −3 | −23.00 | 11.00 | −21.30 | O/E 0" |
| 12 | −4 | −22.80 | 0.4000E−03 | −21.20 | |
| 12 | −5 | −24.70 | 11.00 | −21.30 | |
| 13 | −1 | −29.60 | 0.0000E+00 | −21.30 | |
| 13 | −2 | −29.80 | 11.00 | −21.30 | M/E 20" HTO = 200Å |
| 13 | −3 | 29.40 | 11.00 | −21.30 | M/E 20" HTO = 200Å |
| 13 | −4 | −28.50 | 2.750 | −21.30 | O/E 0" |
| 13 | −5 | −29.40 | 0.0000E+00 | −21.30 | |
| 14 | −1 | −23.10 | 11.00 | −21.30 | |
| 14 | −2 | −25.70 | 11.00 | −21.30 | O/E 5" |
| 14 | −3 | −24.50 | 11.00 | −21.40 | |
| 14 | −4 | −24.20 | 11.00 | −21.30 | |
| 14 | −5 | −23.50 | 11.00 | −21.40 | |
| 15 | −1 | −25.50 | 0.0000E+00 | 0.0000E+00 | |
| 15 | −2 | −25.80 | 0.0000E+00 | −21.20 | O/E 10" |
| 15 | −3 | −26.10 | 0.0000E+00 | −21.20 | |
| 15 | −4 | −25.90 | 0.0000E+00 | 0.0000E+00 | |
| 15 | −5 | −25.80 | 0.0000E+00 | 0.0000E+00 | |
| 16 | −1 | −23.30 | 8.770 | −21.00 | |
| 16 | −2 | −21.90 | 8.810 | −21.00 | O/E 20" |
| 16 | −3 | −22.50 | 8.990 | −21.00 | |
| 16 | −4 | −23.00 | 8.950 | −21.10 | |
| 16 | −5 | −22.30 | 8.950 | −21.10 | |
| 17 | −1 | −23.80 | 8.360 | −18.00 | |
| 17 | −2 | −23.80 | 8.520 | −18.00 | O/E 30" |
| 17 | −3 | −24.00 | 8.750 | −18.40 | |
| 17 | −4 | −23.40 | 0.0000E+00 | −17.50 | |
| 17 | −5 | −24.10 | 0.0000E+00 | −17.70 | |
| 18 | −1 | −22.20 | 8.220 | −15.00 | |
| 18 | −2 | −20.80 | 8.340 | −15.30 | O/E 35" |
| 18 | −3 | −21.50 | 8.570 | −14.90 | |
| 18 | −4 | −22.60 | 0.0000E+00 | −15.50 | |
| 18 | −5 | −21.10 | 0.0000E+00 | −15.10 | |
| 19 | −1 | −30.00 | 11.00 | −21.30 | M/E 40" HTO = 200Å |
| 19 | −2 | 0.0000E+00 | 11.00 | −21.30 | |
| 19 | −3 | −29.90 | 11.00 | −21.30 | O/E 0" |
| 19 | −4 | −29.10 | 0.0000E+00 | −21.30 | |
| 19 | −5 | −29.90 | 11.00 | −21.30 | |
| 20 | −1 | −22.70 | 9.240 | −21.30 | |

TABLE II-continued

W.A.T. DATA SHEET

PRODUCT: TM418  PROCESS: 05TW17S1
LOT ID: A52531.5  DATE: 03/27/1997

| WAF ID | SITE ID | BVOX_NHAC V I = −100 nA | FTV/.6 V | RTV/.6 V | |
|---|---|---|---|---|---|
| 20 | −2 | −23.70 | 9.690 | −21.30 | O/E 5" |
| 20 | −3 | −22.70 | 9.900 | −21.30 | |
| 20 | −4 | −23.50 | 9.670 | −21.30 | |
| 20 | −5 | −22.20 | 0.0000E+00 | −21.30 | |
| 21 | −1 | −24.20 | 0.0000E+00 | −21.20 | O/E 10" |
| 21 | −2 | −24.40 | 9.440 | −21.30 | |
| 21 | −3 | −25.30 | 9.350 | −21.30 | |
| 21 | −4 | −24.20 | 0.0000E+00 | −21.20 | |
| 21 | −5 | −24.60 | 0.0000E−00 | −21.20 | |
| 22 | −1 | −21.90 | 8.440 | −21.10 | O/E 20" |
| 22 | −2 | −20.80 | 8.650 | −21.20 | |
| 22 | −3 | −21.06 | 8.980 | −21.30 | |
| 22 | −4 | −21.50 | 0.0000E+00 | −21.20 | |
| 22 | −5 | −22.20 | 0.0000E+00 | −21.10 | |
| 23 | −1 | −22.50 | 8.280 | −17.80 | O/E 30" |
| 23 | −2 | −22.50 | 8.560 | −17.80 | |
| 23 | −3 | −23.00 | 8.710 | −17.20 | |
| 23 | −4 | −22.30 | 0.0000E+00 | −17.50 | |
| 23 | −5 | −22.70 | 0.0000E+00 | −17.60 | |
| 24 | −1 | −21.20 | 8.120 | 15.10 | O/E 35" |
| 24 | −2 | 20.00 | 8.300 | −15.60 | |
| 24 | −3 | −21.30 | 8.480 | −15.20 | |
| 24 | −4 | −20.80 | 8.270 | −15.50 | |
| 24 | −5 | −20.50 | 0.0000E+00 | −15.10 | |

Summary

1. The stability of the process of FIGS. 2A–2H is better than the process of FIGS. 1A–1E because the etching process window (etching time) is longer than the original process.

2. The method of FIGS. 2A–2I controls the height and width of the "L" shape $Si_3N_4$ spacer.

3. With the method of FIGS. 2A–2I loss of HTO oxide is easily controlled, i.e. HTO oxide loss is less than about 20 Å.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of forming a spacer structure adjacent to the sidewall of a floating gate electrode with a top surface and sidewalls, said floating gate electrode being formed on a silicon oxide dielectric layer, and said silicon oxide dielectric layer being formed on the top surface of a semiconductor substrate, the steps of said method comprising:

a) forming a cap layer of an oxide of said floating gate electrode over the top surface of said floating gate electrode, b) forming a inner, silicon nitride, dielectric, spacer layer over said floating gate electrode and cap layer including said cap layer and said sidewalls thereby forming conforming sidewalls adjacent to said sidewalls, c) forming a outer, silicon oxide, dielectric, spacer layer over said inner dielectric, spacer layer including said conforming sidewalls, said outer spacer layer having a top spacer surface, d) partially etching away said outer, silicon oxide, dielectric, spacer layer to form an outer dielectric spacer adjacent to said conforming sidewalls lowering said top spacer surface of said outer spacer layer to a position located substantially below the top of said floating gate electrode, and e) etching away from an upper portion of said sidewalls above said top spacer surface the portion of said inner, silicon nitride, dielectric, spacer layer unprotected by said outer, silicon oxide, dielectric spacer providing an L-shaped silicon nitride spacer covered by said outer dielectric spacer.

2. A method of forming a spacer structure adjacent to the sidewall of a floating gate electrode in accordance with claim 1 wherein:

after step (d) and before step (e) performing the step of partially etching said outer, silicon oxide, dielectric, spacer layer further to expose a portion of said conforming sidewalls of said inner, silicon nitride, dielectric, spacer layer above said top spacer surface.

3. A method of forming a spacer structure adjacent to the sidewall of a floating gate electrode in accordance with claim 1 wherein:

a dry etching process is used in step (d), and the additional step is performed after step (d) and before step (e) of partially etching said outer, silicon oxide, dielectric, spacer layer with a wet etch to expose a portion of said conforming sidewalls of said inner, silicon nitride, dielectric, spacer layer.

4. A method of forming a spacer structure adjacent to the sidewall of a floating gate electrode in accordance with claim 1 wherein said cap layer has a thickness of about 100 Å.

5. A method of forming a spacer structure adjacent to the sidewall of a floating gate electrode in accordance with claim 1 wherein said inner, silicon nitride, dielectric, spacer layer has a thickness of about 140 Å to about 180 Å.

6. A method of forming a spacer structure adjacent to the sidewall of a floating gate electrode in accordance with claim 1 wherein:

said cap layer has a thickness of about 100 Å, and said inner, silicon nitride, dielectric, spacer layer has a thickness of about 140 Å to about 180 Å.

7. A method of forming a spacer structure adjacent to the sidewall of a floating gate electrode in accordance with claim 1 wherein:

said cap layer has a thickness of about 100 Å, said inner, silicon nitride, dielectric, spacer layer comprises a silicon nitride layer having a thickness of about 140 Å to about 180 Å, and said outer, silicon oxide, dielectric, spacer layer comprises a thick silicon oxide layer.

8. A method of forming a spacer structure adjacent to the sidewall of a floating gate electrode in accordance with claim 1 wherein:

said inner, silicon nitride, dielectric, spacer layer comprises a silicon nitride layer having a thickness of about 140 Å to about 180 Å, said outer, silicon oxide, dielectric, spacer layer comprises a thick layer wherein said step (d) is performed by a dry etching process to partially etch away said outer, silicon oxide, dielectric, spacer layer to form a outer, silicon oxide, dielectric spacer adjacent to said conforming sidewalls, the step (e) of etching away the portion of said inner, silicon nitride, dielectric, spacer layer unprotected by said outer, silicon oxide, dielectric spacer is performed in a wet etching process, and the additional step is performed after step (d) and before step (e) of partially etching said outer, silicon nitride, dielectric, spacer layer with a wet etch to expose a portion of said conforming sidewalls of said inner, silicon oxide, dielectric, spacer layer.

9. A method of forming a spacer structure adjacent to the sidewall of a floating gate electrode in accordance with claim 1 wherein:

said inner dielectric, spacer layer comprises a silicon nitride layer having a thickness of about 140 Å to about 180 Å, said outer dielectric, spacer layer comprises a thick silicon oxide layer wherein said step (d) of partially etching away said outer dielectric, spacer layer to form a outer dielectric spacer adjacent to said conforming sidewalls is performed by a dry etching process, the additional step is performed after step (d) and before step (e) of partially etching said outer dielectric, spacer layer with a wet etch to expose a portion of said conforming sidewalls of said inner dielectric, spacer layer with a hydrofluoric acid solution of about 50 H$_2$O : 1 HF, and the step (e) of etching away the portion of said inner dielectric, spacer layer unprotected by said outer dielectric spacer is performed in a wet etching process using a wet hot phosphoric acid solution (H$_3$PO$_4$).

10. A method of forming a spacer structure adjacent to the sidewall of a floating gate electrode composed of doped polysilicon with a top surface and sidewalls, said floating gate electrode being formed on a silicon oxide dielectric layer, and said silicon oxide dielectric layer being formed on the top surface of a semiconductor substrate, the steps of said method comprising steps performed in the sequence, as follows:

a) forming a cap layer of polysilicon oxide over the top surface of said floating gate electrode followed by forming a thin, blanket, tunnel oxide film over said device, b) forming a inner dielectric, spacer layer over said floating gate electrode and cap layer including said cap and said tunnel oxide layer and adjacent to said sidewalls of said floating gate electrode thereby forming conforming sidewall spacers adjacent to said sidewalls of said floating gate electrode, c) forming a outer dielectric, spacer layer over said inner dielectric, spacer layer including said conforming sidewalls, d) partially etching away said outer dielectric, spacer layer with a dry etch to form a outer dielectric spacer adjacent to said conforming sidewalls, e) the additional step is performed of partially etching away more of said outer dielectric, spacer layer with a wet etch to expose a portion of said conforming sidewalls of said inner dielectric, spacer layer, and f) etching away the portion of said inner dielectric, spacer layer unprotected by said outer dielectric spacer.

11. A method of forming a spacer structure adjacent to the sidewall of a floating gate electrode in accordance with claim 10 wherein said cap layer has a thickness of about 100 Å.

12. A method of forming a spacer structure adjacent to the sidewall of a floating gate electrode in accordance with claim 10 wherein said inner dielectric, spacer layer has a thickness of about 140 Å to about 180 Å.

13. A method of forming a spacer structure adjacent to the sidewall of a floating gate electrode in accordance with claim 10 wherein:

said cap layer has a thickness of about 100 Å, and said inner dielectric, spacer layer comprises silicon nitride and has a thickness of about 140 Å to about 180 Å.

14. A method of forming a spacer structure adjacent to the sidewall of a floating gate electrode in accordance with claim 10 wherein:

said cap layer has a thickness of about 100 Å, said inner dielectric, spacer layer comprises a silicon nitride layer having a thickness of about 140 Å to about 180 Å, and said outer dielectric, spacer layer comprises a thick silicon oxide layer.

15. A method of forming a spacer structure adjacent to the sidewall of a floating gate electrode in accordance with claim 10 wherein:

said inner dielectric, spacer layer comprises a silicon nitride layer having a thickness of about 140 Å to about 180 Å, said outer dielectric, spacer layer comprises a thick silicon oxide layer, said wet etch of of step (e) is performed with a hydrofluoric acid solution of about 50 H$_2$O : 1 HF, the step (f) is performed in a wet etching process using a hot phosphoric acid solution (H$_3$PO$_4$), forming an interelectrode dielectric layer over said device, and forming a control gate electrode over said interelectrode dielectric layer to form a memory cell.

16. A method of forming a spacer structure adjacent to the sidewall of a floating gate electrode with a top surface and sidewalls, said floating gate electrode being formed on a silicon oxide dielectric layer, and said silicon oxide dielectric layer being formed on the top surface of a semiconductor substrate, the steps of said method comprising:

a) forming a cap layer of an oxide of said floating gate electrode over the top surface of said floating gate electrode, b) forming a inner, silicon nitride, dielectric, spacer layer over said floating gate electrode and cap layer including said cap layer and said sidewalls thereby forming conforming sidewalls adjacent to said sidewalls, with a thickness from about 140 Å to about 180 Å, c) forming a outer, silicon oxide, dielectric, spacer layer over said inner dielectric, spacer layer including said conforming sidewalls, said outer spacer layer having a top surface, d) partially etching away said outer, silicon oxide, dielectric, spacer layer to form an outer dielectric spacer adjacent to said conforming sidewalls lowering said top surface of said outer spacer layer to a position located substantially below the top of said floating gate electrode, said outer spacer having dimensions from about 150 Å to about 300 Å, and e) etching away from an upper portion of said sidewalls the portion of said inner, silicon nitride, dielectric, spacer layer unprotected by said outer, silicon oxide, dielectric spacer, providing an L-shaped silicon nitride spacer covered by said outer dielectric spacer with a height of about 300 Å vertically and a width of 200 Å horizontally.

17. A method of forming a spacer structure adjacent to the sidewall of a floating gate electrode in accordance with claim 16 wherein:

in step (a) after forming said cap layer, but before performing step (b), forming a thin, blanket, tunnel oxide film over said device.

18. A method of forming a spacer structure adjacent to the sidewall of a floating gate electrode in accordance with claim 16 wherein:

a dry etching process is used in step (d), and the additional step is performed after step (d) and before step (e) of partially etching said outer, silicon oxide, dielectric, spacer layer with a wet etch to expose a portion of said conforming sidewalls of said inner, silicon nitride, dielectric, spacer layer.

19. A method of forming a spacer structure adjacent to the sidewall of a floating gate electrode in accordance with claim 16 wherein:

said wet etch of of step (e) is performed with a hydrofluoric acid solution of about 50 $H_2O$ :1 HF, the step (f) is performed in a wet etching process using a hot phosphoric acid solution ($H_3PO_4$), forming an interelectrode dielectric layer over said device, and forming a control gate electrode over said interelectrode dielectric layer to form a memory cell.

20. A method of forming a spacer structure adjacent to the sidewall of a floating gate electrode in accordance with claim 16 wherein:

using a dry etching process in step (d), and performing a step after step (d) and before step (e) of partially etching said outer, silicon oxide, dielectric, spacer layer with a wet etch with a hydrofluoric acid solution of about 50 $H_2O$:1 HF, to expose a portion of said conforming sidewalls of said inner, silicon nitride, dielectric, spacer layer, performing step (f) in a wet etching process using a hot phosphoric acid solution ($H_3PO_4$), forming an interelectrode dielectric layer over said device, and forming a control gate electrode over said interelectrode dielectric layer to form a memory cell.

\* \* \* \* \*